United States Patent [19]
Merritt et al.

[11] Patent Number: 5,349,566
[45] Date of Patent: Sep. 20, 1994

[54] MEMORY DEVICE WITH PULSE CIRCUIT FOR TIMING DATA OUTPUT, AND METHOD FOR OUTPUTTING DATA

[75] Inventors: Todd A. Merritt; Greg A. Blodgett, both of Boise, Id.

[73] Assignee: Micron Semiconductor, Inc., Boise, Id.

[21] Appl. No.: 64,484

[22] Filed: May 19, 1993

[51] Int. Cl.⁵ .................................................. G11C 7/00
[52] U.S. Cl. ........................ 365/233.5; 365/189.05; 365/191; 365/193
[58] Field of Search ............ 365/189.05, 233.5, 230.08, 365/222, 191, 193, 194, 189.5

[56] References Cited
U.S. PATENT DOCUMENTS

| | | | |
|---|---|---|---|
| 4,701,889 | 10/1987 | Ando | 365/233.5 X |
| 4,872,143 | 10/1989 | Sumi | 365/233.5 |
| 4,947,379 | 8/1990 | Okuyama | 365/233.5 |
| 5,014,245 | 5/1991 | Muroka | 365/193 X |
| 5,058,066 | 10/1991 | Yu | 365/189.05 |
| 5,111,386 | 5/1992 | Fujishima | 365/189.05 X |
| 5,200,926 | 4/1993 | Iwahashi | 365/189.05 X |

Primary Examiner—Eugene R. LaRoche
Assistant Examiner—Son Mai
Attorney, Agent, or Firm—Wells, St. John, Roberts, Gregory & Matkin P.S.

[57] ABSTRACT

A memory device includes an output buffer for temporarily storing first and second data that are sequentially retrieved from a memory array during a read cycle. The output buffer holds the first data until it is replaced by the second data. A pulse circuit is connected to the memory array and output buffer, and is designed to generate a pulse signal as soon as data becomes valid. The pulse signal causes the output buffer to replace the first data with the second data and to latch the second data therein until receipt of the next data. The pulse circuit generates the data valid signal upon receipt of the column address strobe and the presence of data on the data I/O lines. A method for outputting data from the memory device is also described.

13 Claims, 4 Drawing Sheets

FIG. 4

MEMORY DEVICE WITH PULSE CIRCUIT FOR TIMING DATA OUTPUT, AND METHOD FOR OUTPUTTING DATA

TECHNICAL FIELD

This invention relates to memory circuits, and more particularly, to memory circuits having pulse circuitry for generating a data output timing signal. This invention also relates to a method for outputting data from a memory device.

BACKGROUND OF THE INVENTION

The basic unit of information for storage and retrieval in digital systems is the data bit, a binary number having a value of zero or one. A data bit in a digital system has logic states of "high" and "low," often corresponding to a physical parameter such as the voltage at a node in a circuit. Information stored in semiconductor circuits is quantified in terms of the number of bits stored. These circuits, collectively called memory devices, include latches, flip-flops, registers, and memories depending to some extent on the number of bits stored. However, the fundamental circuit for storing a data bit, herein called a memory cell, is the common building block from which latches, flip-flops, registers, memories, and the like are made.

Several common circuits have been used for the memory cell in the various types of memory devices. Some devices including dynamic random access memory (DRAM) employ a memory cell circuit having one transistor and one capacitor. The DRAM cell provides one signal for stored data. Other devices including the static random access memory (SRAM) employ a memory cell circuit having primarily a cross coupled pair of transistors. The SRAM cell provides two complementary signals for stored data. For example, when the signals are respectively D and D*, a zero is represented when D is low and D* is high, and a one is represented when D is high and D* is low. Other combinations of D and D* are undefined; that is, they serve no purpose in the memory device.

Memory devices that are used for storing many bits of information provide an output data signal in response to an input address signal during a "read" operation called a read cycle. In a complex memory device, the read operation may be performed as a process of selecting, sensing, and outputting the content of memory cells. The duration of such a process is called the access time. Complex memory devices may have several types of operations distinguished by control signals including read/write, address strobes, programming and erasure strobes, transfer enable, and output enable signals. The read cycle begins when the operation is defined by these control signals and an address is specified on the address input of the memory device.

The address can be specified in one of several ways depending on the design of the memory device. For example, an address can be specified serially in conjunction with a clock signal or in parallel with a strobe signal. A combination of these methods could be used, for example, by presenting on 16 parallel address lines a 32-bit address in two steps accompanied by upper and lower address strobes. In a conventional DRAM, these strobes are associated with the row and column organization of memory cells in an array. Designs for high density memory devices employ several arrays of cells having minute dimensions. Typically, the signal or signals representing the data bit in a memory cell are weak.

The read cycle concludes with presentation of signals for use outside the memory device that represent the data addressed. The weak signal levels internal to the memory device are sensed and amplified. Amplified signals at internal signal levels are then translated to conventional logic levels and gated onto the output terminals of the memory device. The level translation and gating are accomplished by an output buffer circuit. When the output buffer is supplying a signal on the output terminal, it is said to be gated on, or enabled; otherwise it is off or disabled.

Memory circuit timing is critical to the efficiency of many systems applications for memory devices. In a computer system, for example, the processor and memory devices are connected by a signal path called a bus. The bus is used for information flow between the processor and other devices connected thereto. One measure of system efficiency is the extent of time the bus is idle or unusable. The bus is "idle" when it is not being used by any device. The bus is "unusable" when it is dedicated to a device but the signal on the bus is invalid, conveying no useful information.

Conventional DRAM devices used in computer systems allow the output buffer to provide spurious signals on the bus causing the bus to be unusable for a period of time. This problem is described in terms of DRAM devices in a computer system, but exists in other applications and with other types of memory devices. For the DRAM application, the bus is unusable for a time preceding output of valid data. A read cycle begins when the row address strobe (RAS*) falls (a high to low transition) at a time when the address input specifies the row address. When the column address is specified on the address input, the column address strobe (CAS*) falls. Conventionally, the output buffer is enabled a short delay after CAS* falls and before data can be guaranteed to be valid. Hence, spurious signals can appear on the bus, and consequently other uses of the system bus must wait until the memory device is no longer dedicated to the bus, and power is wasted while driving spurious signals to conventional logic levels.

In other conventional memory devices including DRAM and video random access memory (VRAM) devices, read operations have a so-called "page mode" wherein a row address is specified for use with several subsequently specified column addresses. Column address changes are detected by a circuit that provides a timing pulse. The timing pulse enables the output buffer after a fixed predetermined delay. The delay may be too short for some memory cells and sense amplifiers that respond relatively slowly due to physical location or circuit element variations caused by fabrication process variations. In such a case, the output buffer is enabled (upon the expiration of the delay) at a time when spurious signals exist on the data path. If the delay is long enough to avoid all spurious signals, data from faster cells will wait at the output buffer before the buffer is enabled. A faster access time would have been possible had the delay been shorter.

Some conventional memory devices perform back to back read operations. In such a device, a subsequent read cycle immediately follows latching previously read data in the output buffer. A timing pulse operates the latch after a fixed predetermined delay. In some devices, column address changes are detected by a circuit that provides the timing pulse. The delay must be designed to allow for the precharge, address decoding, sensing, and driving required for the longest read operation in order to guarantee that the latched data represents the content or the memory and not spurious signals preceding the memory content signal. When the delay is long enough to avoid all spurious signals, data from faster cells wait at the output buffer before the latch is enabled. A faster access time would have been possible had the delay been shorter.

DRAM or VRAM devices designed to enable the output buffer after a fixed predetermined delay cannot be effectively sorted by access time. When many devices are manufactured on a single wafer, the predetermined delay must be long enough to account for process variation. For example, if the delay is long enough to guarantee operation of all devices on the wafer, the performance of some of the devices is limited by the delay. These devices could have been sorted and guaranteed at a faster access time than the access time of other devices on the same wafer. Memory devices guaranteed at a faster access time command a higher market price and facilitate new and improved systems from integrated microprocessors to automated equipment.

Thus, there remains a need for a memory device whose output buffers do not output spurious signals. In addition, there remains a need for an improved method for reading a memory cell without dependence on predetermined delays. Further improvement in performance of systems using memory devices can be gained by employing methods of the present invention and incorporating circuits of the present invention in the design of memory devices.

BRIEF DESCRIPTION OF THE DRAWINGS

Preferred embodiments of the invention are described below with reference to the following accompanying drawings.

FIG. 4 is a timing diagram describing a method of controlling the memory device and of timing data output according to this invention. The vertical axis represents binary logic levels and the horizontal axis represents time. Neither axis is drawn to scale. The vertical axis is intended to show the transition from active (asserted) to passive (non-asserted) states of each logic signal. The voltage levels corresponding to the logic states of the various signals are not necessarily identical among the various signals.

Signals that appear on several Figures and have the same mnemonic are directly or indirectly coupled together. A signal named with a mnemonic and a second signal named with the same mnemonic followed by an asterisk are related by logic inversion.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

According to an aspect of this invention, a memory device comprises:

a memory array;

an output buffer operatively coupled to the memory array, the output buffer temporarily storing data that is retrieved from the memory array during a read cycle, the output buffer holding the data until it is replaced by subsequently retrieved data; and a pulse circuit operatively coupled to the memory array and the output buffer, the pulse circuit outputting a pulse signal as soon as data is valid which causes the output buffer to store the retrieved data.

According to another aspect of this invention, a memory device comprises:

a memory array for storing data;

a read/write system for providing row and column address signals for accessing the data stored in the memory array during a read cycle;

a data present circuit for providing a data present signal when the data is retrieved from the memory array;

a sliding pulse circuit coupled to receive the data present signal and the column address signal, the sliding pulse circuit providing a data valid signal upon receipt of both the data present signal and the column address signal;

a row address valid circuit coupled to receive the data valid signal and the row address signal, the row address valid circuit generating a pulse signal upon receipt of the row address signal and the data valid signal; and an output buffer, operatively coupled to the memory array, for temporarily storing the retrieved data upon receipt of the pulse signal from the row address valid circuit.

Figure 1:
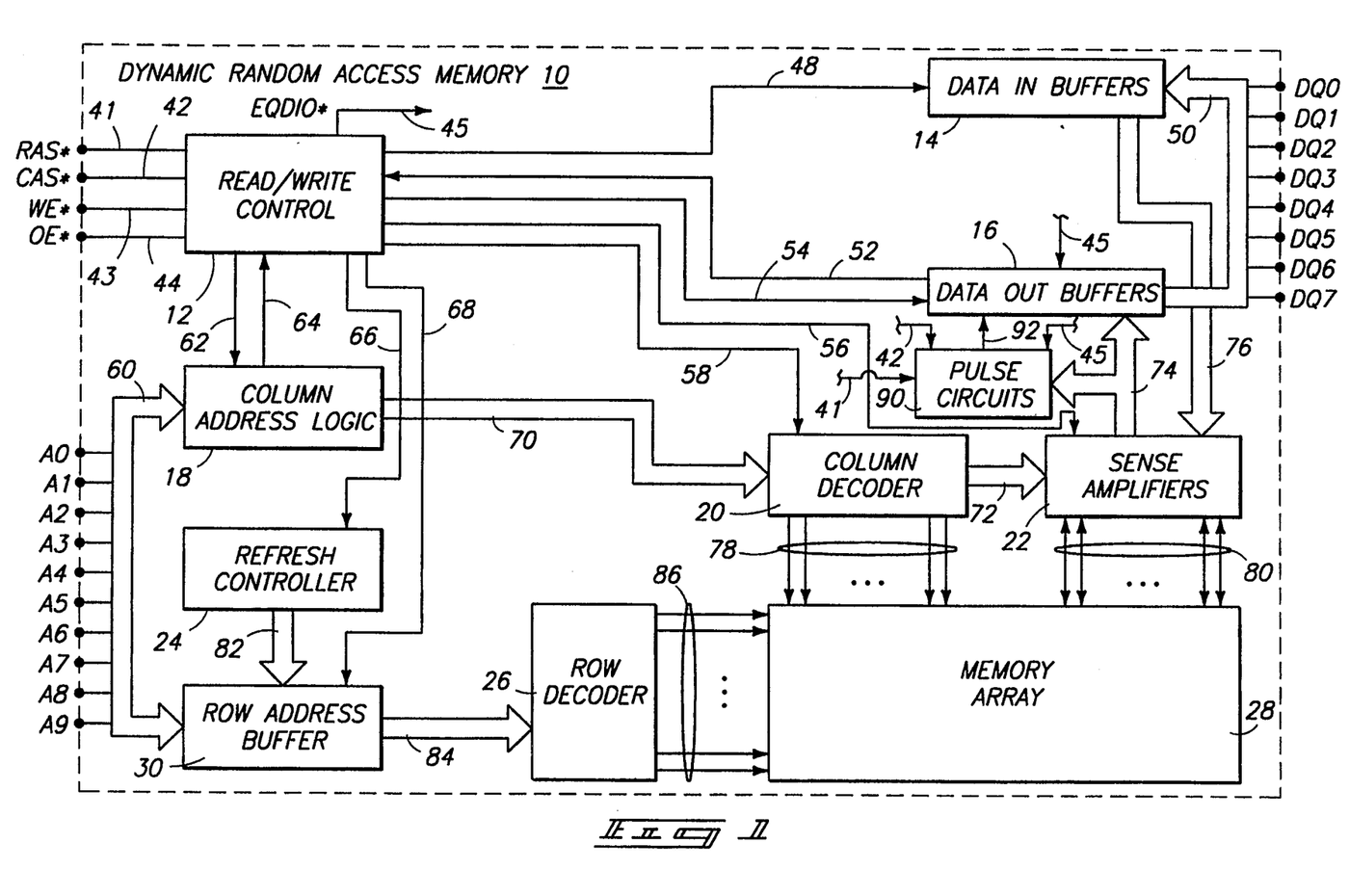
FIG. 1 is a block diagram of a dynamic random access memory device according to this invention.

FIG. 1 is a functional block diagram of a dynamic random access memory device 10 of the present invention. This invention can be employed in other memory devices, but is described for purposes of explanation in the context of a DRAM. Memory device 10 has a memory array 28 and a read/write system for providing row and address signals to access memory cells in the memory array 28. The read/write system includes read/write control 12, decoders 20 and 26, column address logic 18, and row address buffer 30. DRAM 10 has multiple address inputs A0–A9 coupled to an internal address bus 60 and multiple data lines DQ0–DQ7 coupled to an internal bus 50.

Memory device 10 is controlled by binary control signals 41-44 input to read/write control 12. Control signals 41-44 are conventionally known by names corresponding to the primary function of each signal. Signal 41 is a row address strobe (RAS*). Signal 42 is a column address strobe (CAS*). Signal 43 is a write enable (WE*). Signal 44 is an output enable (OE*). When RAS* falls, the state of address bus 60 is latched in row address buffer 30 in response to control signals 68. When CAS* falls, the state of address bus 60 is latched in column address logic 18 in response to control signals 62. Read/write control 12 also responds to changes in the column address, as indicated by address change signals 64, for improved read access time as in page mode.

Several read and write modes of operation are conducted by read/write control 12 in response to combinations of control signals 41-44 and address change signals 64. Refresh mode is one such operation conducted in cooperation with refresh controller 24. In contrast to read and write operations, refresh does not normally require signals on address bus 60 or data bus 50.

A single memory cell of memory array 28 is selected for read and write operations according to the intersection of a decoded row signal and a decoded column signal. Binary row address bus 84 is coupled to row decoder 26. Row decoder 26 asserts a row select signal on one or more row activating signals 86. Column address logic 18 presents binary column address bus 70 to column decoder 20. Column decoder 20 asserts a column select signal on one or more of the column activating signals 78. A portion of the binary column address (as referenced by numeral 72) is also coupled to sense amplifiers 22 to support further decoding as may be required. If row decoder 26 and column decoder 20 provide signals that activate more than one memory cell from memory array 28, further selection is accomplished by decoding circuits functionally included in sense amplifiers 22. Hence, memory array 28 can be implemented as a single row-column array or in more than one row-column array. As shown in FIG. 1, memory array 28 includes one or more arrays such that eight cells, one cell for each DO line in data bus 50, are selected by the intersection of a decoded row signal and a decoded column signal.

Sense amplifiers 22 functionally include circuitry that may be spatially distributed integral to memory array 28, or external to memory array 28, or both. Memory array 28 is coupled to sense amplifiers 22 by a group of input/output (I/O) signals 80. I/O signals 80 may be activated one per selected cell or one pair per selected cell depending on the design of the memory cell in memory array 28.

Sense amplifiers 22 perform several functions responsive to control signals 56. When cell contents are to be overwritten in a write operation, driver circuits in sense amplifiers 22 establish proper cell contents in response to write data signals 76 from data in buffers 14. In read operations, cell contents are amplified and presented to data out buffers 16 on data I/O (DIO) signals 74.

Data out buffers 16 are instrumental for read operations. Data out buffers 16 drive data bus 50 which comprises several individual data lines shown as DQ0–DQ7. Alternate memory devices may have less or more DQ lines and may have separate lines for the data in (D) function and the data out (Q) function. As shown, memory device 10 has eight DQ lines, each of which is bidirectional and driven by a three state circuit in output buffers 16. The output of a three state circuit represents a logic low, a logic high, or an off state. In the off state, the three state circuit provides a high impedance to the DQ line so that drive circuits external to memory device 10 can drive a signal onto the DQ line for "data in buffer" 14 without contention. Additionally, bus 50 may be used to connect two or more external devices without interference from device 10.

Pulse circuits 90 are operatively coupled to memory array 28 via bus 74 and sense amplifiers 22. More particularly, pulse circuits 90 are connected to receive the data I/O signals 74 from sense amplifiers 22. The pulse circuits generate pulse signals 92 as soon as data read from memory array 28 becomes valid. Pulse signals 92 cause the output buffers 16 to receive and latch the valid data.

DRAM 10 is configured to operate in an extended data out (EDO) mode or a non-EDO mode. In the latter mode, the row address strobe (RAS*) and column address strobe (CAS*) determine when data is placed in data out buffers 16. When both RAS* and CAS* are asserted, valid data is transferred to data out buffers 16. The data can remain valid even when either RAS* or CAS* become non-asserted. On the other hand, when RAS* and CAS* are not asserted, data out buffers 16 remain in the tri-state condition and provide high impedance on the DQ lines 50.

As memory speeds increase, the duration of the column address strobe (CAS*) becomes smaller, and thus the time that data is valid becomes shorter. In some memory devices, data may only be valid at the output buffer for two nanoseconds or less. Furthermore, the column address strobe (CAS*) must toggle and precharge to effectuate timing within the memory device. This toggle requires a finite period of time which further affects the duration that data is valid at the output buffer. Accordingly, in the non-EDO mode, the data out buffers 16 are repeatedly changing between valid data and the tri-state condition.

In the extended data out (EDO) mode, the data out buffers 16 are not switched to the third or high impedance state during the read cycles. Instead, data placed in the data out buffers remains there until it is replaced with new data. The pulse circuits 90 of this invention generate internal pulse signals 92 that control when data out buffers 16 replace old data with new data. The output buffers return to the tri-state condition for write operations and new row addresses.

For purposes of continuing discussion, DRAM 10 is assumed to be operating in an EDO page mode wherein the read cycles of this mode are such that multiple column address strobes (CAS*) occur within a single asserted row address strobe (RAS*) and the data remains latched in the output buffers until replaced.

Figure 2:
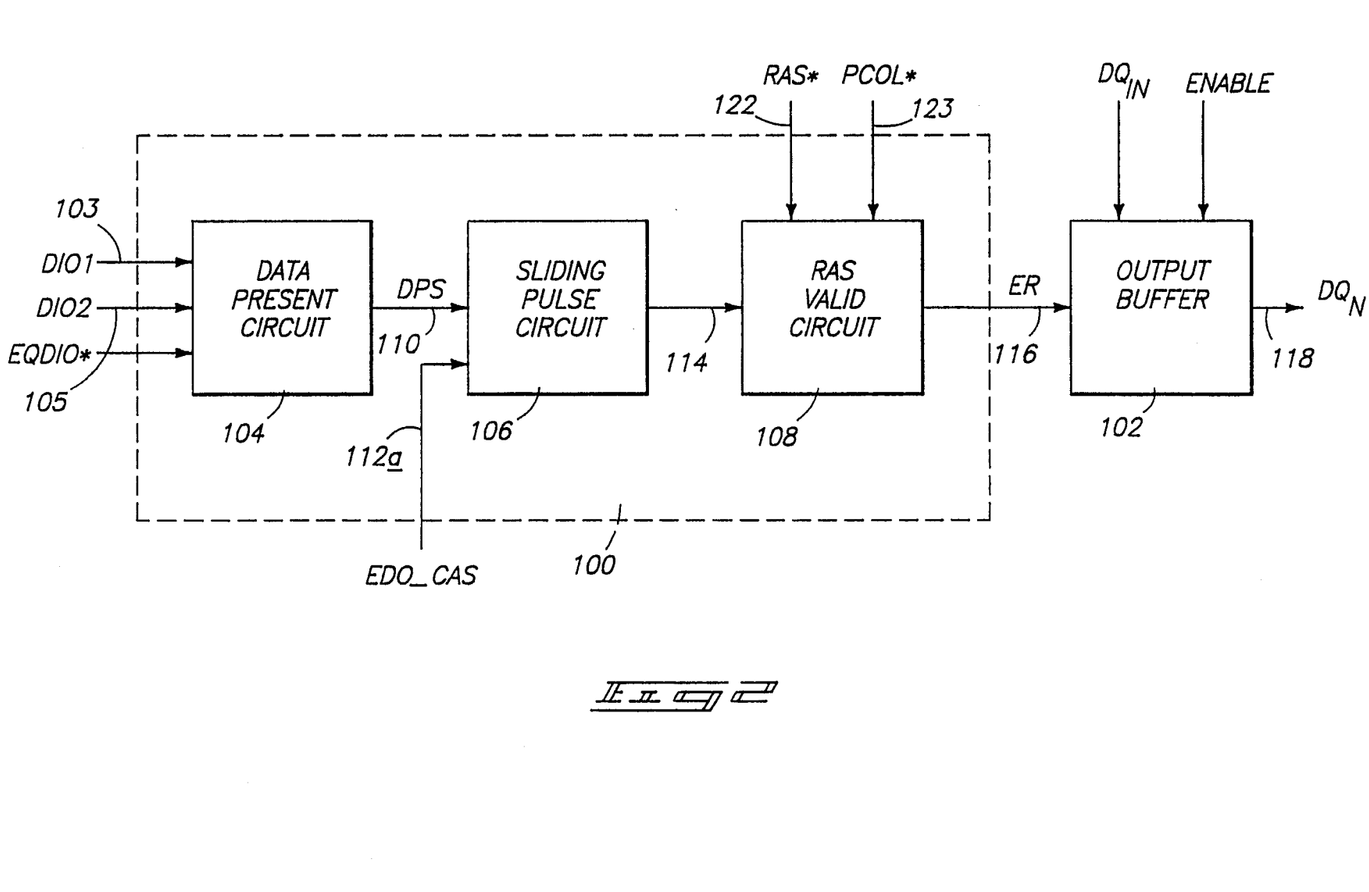
FIG. 2 is a block diagram of a pulse circuit of the FIG. 1 memory device.

FIG. 2 shows a pulse circuit 100 which is part of the pulse circuits 90 shown in FIG. 1. Pulse circuit 100 is connected to an output buffer 102, which is part of data out buffers 16. Multiple pulse circuits 100 and output buffers 102 are provided for individual DQ lines ($DQ_N$).

Pulse circuit 100 includes a data present circuit 104, a sliding pulse circuit 106, and a RAS valid circuit 108. Taken together, data present circuit 104 and sliding pulse circuit 106 form a validation means for determining when data is valid. Data present circuit 104 is coupled to receive data I/O signals DIO1 and DIO2 from bus 74 (as represented by lines 103 and 105) and an equilibrate signal EQDIO* Data present circuit 104 generates a data present signal (DPS) 110 when data is read from the memory array as represented by transition in one or more of the signals DIO1 and DIO2.

Sliding pulse circuit 106 is coupled to receive the data present signal 110 and an address signal 112a. The address signal 112a is in the form of a column address strobe. The notation "EDO CAS" refers to the column address strobe in the extended data out mode. Essentially, the EDO_CAS signal is a buffered version of, and is slightly delayed from, the CAS signal.

When both the data present signal 110 and the address signal 112a are available at sliding pulse circuit 106, the data being retrieved from memory array 28 is valid and available to be transferred to the data out buffers 16. Sliding pulse circuit 106 generates a data valid signal 114 when this condition occurs. As described a different way, the data valid signal is output upon receipt of the later of the data present signal 110 and the column address strobe 112a. In this manner, the data valid signal (and hence, the ER pulse signal) effectively "slides" in time depending upon the order of receipt of the data present signal 110 and the column address strobe 112a.

RAS valid circuit 108 evaluates whether the row address strobe is still asserted to insure that the memory device is in a read cycle. If the row address strobe is asserted, the data valid signal 114 is passed through as an enable read (ER)pulse 116 to output buffer 102. Conversely, if the row address strobe is no longer asserted, thereby indicating the end of a read cycle, the data being retrieved from the memory array 28 is not valid and does not need to be placed or transferred into the data out buffers 16.

Output buffer 102 is configured to receive and latch new output data ($DQ_{IN}$) upon receipt of the ER pulse 116. Data $DQ_{IN}$ is then brought to the appropriate voltage level and driven out as data signal 118.

The general operation of pulse circuit 100 will now be described. According to an aspect of this invention, a method for outputting data from a memory device comprises the following steps: (1) storing data in a memory array; (2) addressing the memory array to retrieve the data; (3) reading the data from the memory array; (4) generating a pulse signal when both (a) the memory array is addressed, and (b) the data is read from the memory array; and (5) transferring the data from the memory array to the output buffer in response to the pulse signal.

Figure 4:
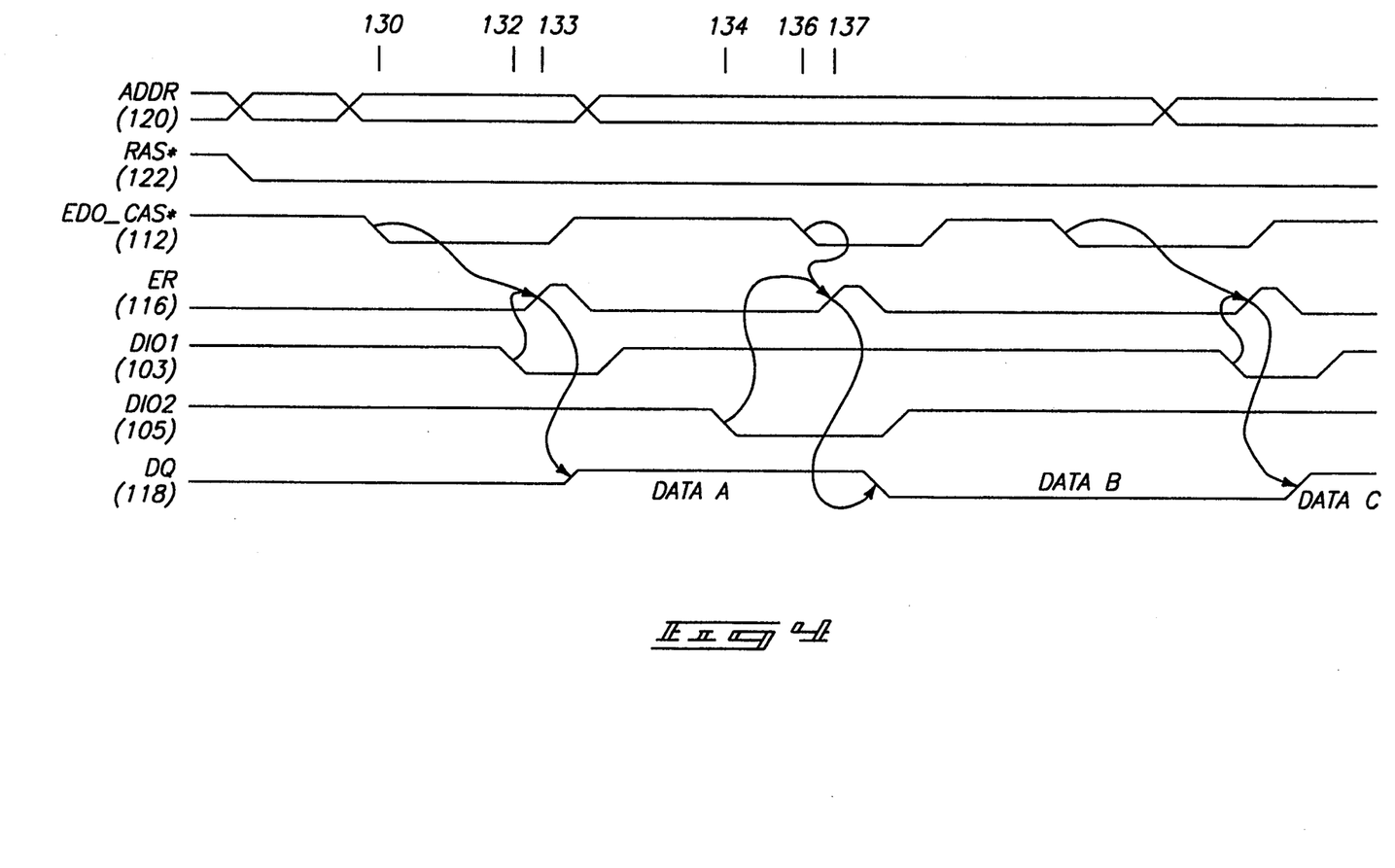

With reference to the Figures, and primarily to the timing diagram of FIG. 4, the row address strobe (RAS*) 122 falls to begin a series of read cycles that are controlled by the column address strobe during the extended data out page mode. Once RAS* is low, data access of the memory array is controlled by the EDO_CAS* 112. The pulse circuit 100 is designed to generate an ER pulse signal 116 upon the presence of both EDO_CAS 112a (the logical inversion of EDO_CAS* 112) and a data signal DIO1 or DIO2.

As shown in the timing diagram of FIG. 4, EDO_CAS* goes low at time 130 and data signal DIO1 goes low at time 132. When this occurs, sliding pulse circuit 106 generates a data valid signal 114 which, if RAS* 122 remains low, is passed through RAS valid circuit 108 and effectively becomes the ER pulse signal 116. Accordingly, when both the EDO_CAS* 112 and DIO1 103 fall during a valid read cycle, the ER pulse signal 116 is generated. This allows data A to be transferred to, and latched in, output buffer 102 and made available as output signal 118. Data A is maintained in buffer 102 and remains valid at outputs $DQ_N$ even though the column address strobe 112 and data I/O signal 103 return high.

In another situation, the data signal may precede the column address strobe. As an example, DIO2 105 goes low at time 134 and EDO_CAS* 112 goes low at a later time 136. With both signals low during the read cycle (RAS* still low), the ER pulse is once again generated immediately thereafter at time 137. This pulse causes the data output buffer 102 to replace old data A with new data B.

It is important to note that data A remains valid at data outputs DQ during the time that addressing, equilibration, and other internal control signals are being generated. Furthermore, the valid data A is then replaced immediately with valid data B. Therefore, an advantage of this invention is that the window of time during which data is valid at the DRAM outputs is maximized. The only invalid duration occurs during the transition from data A to data B.

Figure 3:
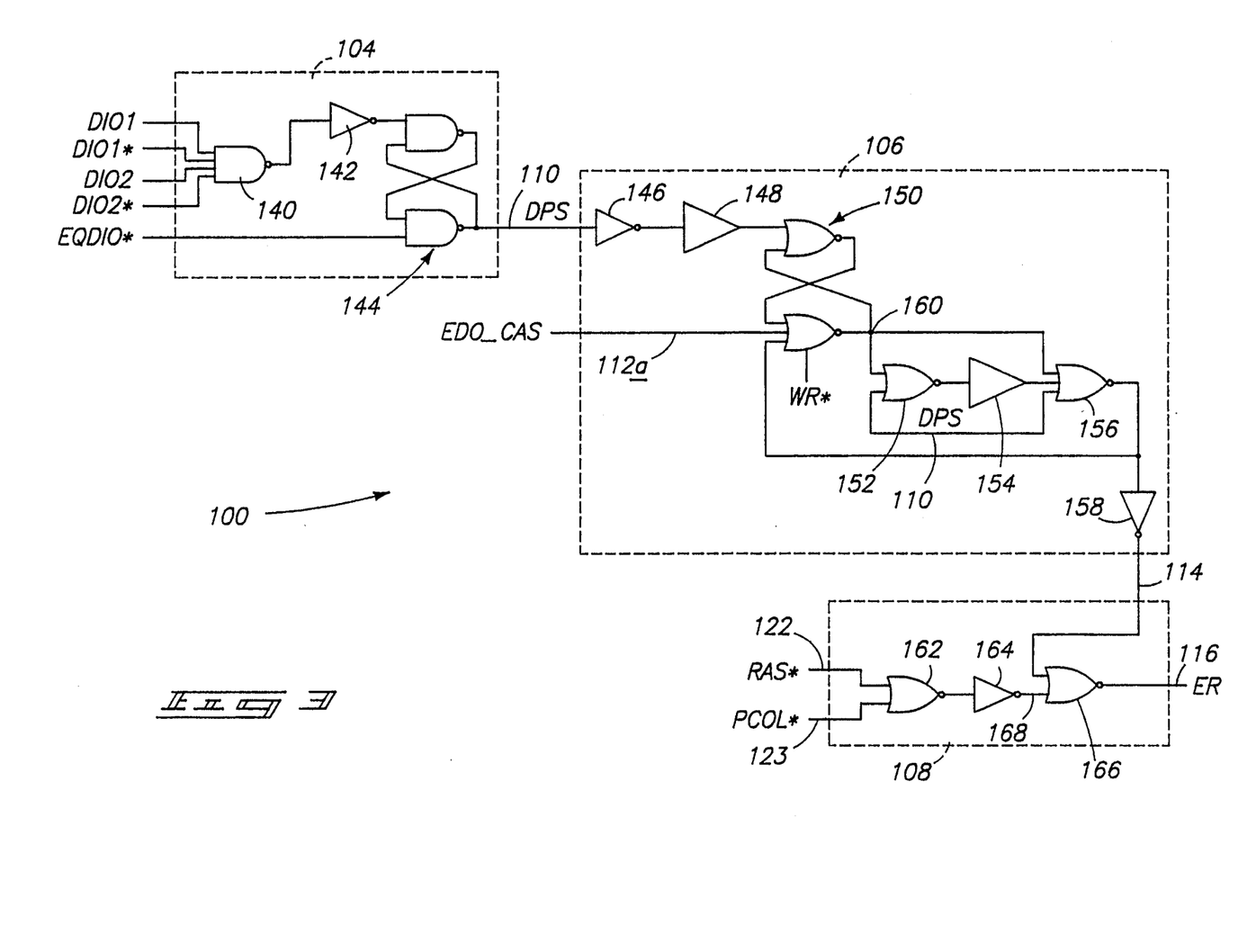
FIG. 3 is a schematic diagram of one embodiment of the FIG. 2 pulse circuit.

FIG. 3 illustrates a preferred implementation of the pulse circuit 100 according to this invention. Data present circuit 104 includes a NAND gate 140, an inverter 142, and a NAND-gate latch 144. NAND gate 140 is coupled to receive data I/O signals DIO1, DIO1*, DIO2, and DIO2*. An equilibrate signal EQDIO* is provided as an input to latch 144. Data present circuit 104 generates a data valid signal 110 (i.e., DPS is low) when the equilibrate signal is high and one of the data I/O signals goes low (for example, when the DIO1 signal 103 goes low at time 132 in FIG. 4). Accordingly, a data valid signal 110 is generated upon receipt of any data I/O signal, so long as the DRAM is in an appropriate read mode and the row/column lines of the memory array are not being equilibrated.

Sliding pulse circuit 106 includes an inverter 146, a first delay circuit 148, a NOR-gate latch 150, NOR gates 152 and 156, a second delay circuit 154, and an inverter 158. The data present signal 110 is input to inverter 146 and NOR gates 152, 156. As above, data present signal 110 is low when valid data is available and ready to be read from one of the I/O lines.

The EDO_CAS signal 112a is input to latch 150. This signal is the inverse of the column address strobe EDO_CAS* 112 illustrated in the timing diagram of FIG. 4. When EDO_CAS 112a rises (EDO_CAS* falls) and the data present signal (DPS) 110 falls, the digital voltage level at node 160 is driven low. This places two low signals at NOR gates 152 and 156. The output of gate 152 transitions high, but this transition is delayed a finite period within delay 154 so that NOR gate 156 receives three low signals for the same finite period. With three low inputs, NOR gate 156 outputs a high signal that is inverted at gate 158 to produce a low data valid signal 114. This low data valid signal 114 represents that data is valid and ready to be read to the output buffer as conditioned upon the presence of data and the presence of the column address strobe.

The data valid signal 114 is input to RAS valid circuit 108, and more particularly, into a NOR gate 166. The RAS* signal 122 and PCOL* signal 123 are input to a NOR gate 162, whose output is inverted by inverter 164. The PCOL* signal 123 is generated internally and is a slightly delayed version of the row address signal RAS*. Accordingly, if row address strobe signal 122 is low (as indicated in the timing diagram of FIG. 4) and the PCOL* signal is low, a low signal 168 is input to NOR gate 166. This condition reflects that the RAS* is still asserted low and a valid read operation remains ongoing.

When the low data valid signal 114 and the low signal 168 are received, NOR gate 166 outputs the ER pulse signal 116 as a high signal. This is shown in the FIG. 4 timing diagram at times 133 and 137 subsequent to receipt by pulse circuit 100 of the column address strobe signal 112 at times 130 and 134, and the data signal DIO1 at times 132 and 136.

The NOR latch 150 of sliding pulse circuit 106 also has an input that receives a write signal WR*. This signal could be the write enable (WE*) signal 43, or a variation of WE* that is conditioned by other logic circuitry. The WR* signal effectively disables the pulse circuit 100 during a write operation. When WR* is low (representing a write cycle), latch 150 will automatically output a high signal regardless of its inputs. Conversely, when WR* is high, latch 150 functions normally as described above.

According to another aspect of this invention, the ER pulse signal 116 has a fixed duration. Preferably, the duration is approximately 2–4 ns. The ER pulse can be of finite duration because its only purpose is to cause the output buffer to latch new data. The fixed duration is achieved by second delay circuit 154. When the signal at node 160 and the DPS 110 are low, NOR gate 152 outputs an asserted high signal. Delay circuit 154 delays this asserted high signal for a finite duration, and then inputs the high signal to NOR gate 156. Thereafter, NOR gate 156 outputs a low signal which is inverted by gate 158 to provide a high signal 114. As a result, gate 166 will return ER pulse signal 116 to a low level.

The pulse circuit is advantageous because the data can be latched on the falling edge of the pulse. This permits the read lines and subsequent equilibrates to begin preparation for the next read as soon as possible, thereby reducing precharge time requirements. That is, the precharging phase commences immediately after the data is latched, and does not wait for CAS*. This yields another benefit that the time duration of CAS* can be reduced.

In alternative embodiments, pulse circuit 100 can employ pulse width circuits that create ER pulses with variable widths. As an example, the ER pulse signal 116 could go high upon receipt of column address strobe EDO_CAS*, and then return low upon receipt of the data present signal 110, or vice versa. With this modified circuit, the data output buffer 102 would receive and latch the new data upon the trailing edge of the variable width ER signal.

The present invention is advantageous over prior art circuits in that the data remains valid at the output for the longest possible time. The data is only invalid during transition between two valid data signals. Old data is replaced with newly read data as soon as valid data is available. This occurs when two conditions exist: (1) the memory array is addressed as represented by the column address strobe, and (2) data is read from the memory array as represented by a separation on the data I/O lines.

This invention effectively eliminates the condition when it is unknown whether data is yet valid. The memory device takes a time $T_{CAC}$ following transition of the column address strobe for the column address to propagate through the memory circuitry. Additionally, it takes a time $T_{AA}$ following transition of the column address strobe for data to be read from a memory cell. As an example, time $T_{CAC}$ is approximately 15 ns and time $T_{AA}$ is approximately 40 ns. By triggering the ER pulse to the EDO_CAS and DIO signals, the circuit of this invention is designed to wait for the later of $T_{CAC}$ or $T_{AA}$ before generating the data valid signal (or essentially, the ER pulse signal) which causes new data to be sent and latched into the output buffer. In this manner, invalid data on the output is minimized without any speed degradation.

In this design, the last read outputs will remain valid beyond the next read cycle (i.e., when the column address strobe goes low) until the next read data is valid. If the system is latching the data on the falling edge of the column address strobe, this design will provide greater margin for data hold without any speed penalties.

Once data is valid and latched, the read lines and other internal circuitry of the DRAM can be reinitialized in preparation for possible additional cycles regardless of any address strobe transition. In this manner, continuous valid data is provided during an extended data out mode during fast page mode read cycles.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A memory device comprising:
   a memory array;
   an output buffer operatively coupled to the memory array, the output buffer temporarily storing data that is retrieved from the memory array during a read cycle, the output buffer holding the data until it is replaced by subsequently retrieved data; and
   a pulse circuit operatively coupled to the memory array and the output buffer, the pulse circuit outputting a pulse signal as soon as data is valid which causes the output buffer to store the retrieved data.

2. A memory device according to claim 1 wherein the pulse circuit comprises:
   validation means for determining when the data is valid.

3. A memory device according to claim 1 wherein the pulse circuit comprises:
   validation means for determining when the data is valid, the validation means being coupled to receive (1) the data and (2) an address signal for retrieving the data from the memory array, the validation means outputting a data valid signal when the validation means receives both the data and the address signal.

4. A memory device according to claim 1 wherein the pulse circuit comprises:
   a data present circuit, coupled to receive the data, for providing a data present signal upon receipt of the data; and
   a sliding pulse circuit for generating a data valid signal upon receipt of both the data present signal and an address signal used to retrieve the data from the memory.

5. A memory device comprising:
   a memory array;
   an output buffer operatively coupled to the memory array, the output buffer temporarily storing data that is retrieved from the memory array during a read cycle, the output buffer holding the data until it is replaced by subsequently retrieved data; and
   a pulse circuit operatively coupled to the memory array and the output buffer, the pulse circuit outputting a pulse signal as soon as data is valid which causes the output buffer to store the retrieved data, the pulse circuit being configured to output a pulse signal of fixed duration.

6. A memory device comprising:
   a memory array;
   an output buffer operatively coupled to the memory array, the output buffer temporarily storing data that is retrieved from the memory array during a read cycle, the output buffer holding the data until it is replaced by subsequently retrieved data; and
   a pulse circuit operatively coupled to the memory array and the output buffer, the pulse circuit outputting a pulse signal as soon as data is valid which causes the output buffer to store the retrieved data, the pulse circuit being configured to output a pulse signal of variable duration.

7. A memory device comprising:
a memory array for storing data;
a read/write system for providing row and column address signals for accessing the data stored in the memory array during a read cycle;
a data present circuit for providing a data present signal when the data is retrieved from the memory array;
a sliding pulse circuit operatively coupled to the read/write system and the data present circuit, the sliding pulse circuit providing a data valid signal upon receipt of both the data present signal and the column address signal;
a row address valid circuit operatively coupled to the read/write system and the sliding pulse circuit, the row address valid circuit generating a pulse signal upon receipt of the row address signal and the data valid signal; and
an output buffer, operatively coupled to the memory array, for temporarily storing the retrieved data upon receipt of the pulse signal from the row address valid circuit.

8. A memory device according to claim 7 wherein the sliding pulse circuit includes a pulse width circuit for establishing a duration of the data valid signal.

9. A memory device according to claim 7 wherein the sliding pulse circuit includes a delay circuit for establishing a fixed duration of the data valid signal.

10. A method for outputting data from a memory device, the method comprising the following steps:
providing a memory array having data stored therein;
addressing the memory array to retrieve the data;
reading the data from the memory array;
generating a pulse signal when both (1) the memory array is addressed and (2) the data is read from the memory array; and
transferring the data from the memory array to the output buffer in response to the pulse signal.

11. A method according to claim 10 further comprising generating a pulse signal of fixed duration.

12. A method according to claim 10 further comprising generating a pulse signal of variable duration.

13. A method for outputting data from a memory device, the method comprising the following steps:
providing a memory array having first and second data stored therein;
addressing a first memory location containing the first data;
reading the first data from the memory array;
generating a first pulse signal when the first memory location is addressed and the first data is read from the memory array;
transferring the first data from the memory array to an output buffer in response to the first pulse signal;
temporarily holding the first data in the output buffer;
addressing a second memory location containing the second data;
reading the second data from the memory array;
generating a second pulse signal when the second memory location is addressed and the second data is read from the memory array; and
transferring the second data from the memory array to the output buffer to replace the first data in response to the second pulse signal.

* * * * *